United States Patent
Zhang et al.

(10) Patent No.: US 11,910,730 B2
(45) Date of Patent: Feb. 20, 2024

(54) JOSEPHSON JUNCTION, JOSEPHSON JUNCTION PREPARATION METHOD AND APPARATUS, AND SUPERCONDUCTING CIRCUIT

(71) Applicant: ALIBABA GROUP HOLDING LIMITED, Grand Cayman (KY)

(72) Inventors: Xiaohang Zhang, Hangzhou (CN); Wenlong Yu, Hangzhou (CN); Hsiang-Sheng Ku, Hangzhou (CN); Jingwei Zhou, Hangzhou (CN)

(73) Assignee: Alibaba Group Holding Limited, Grand Cayman (KY)

( * ) Notice: Subject to any disclaimer, the term of this patent is extended or adjusted under 35 U.S.C. 154(b) by 175 days.

(21) Appl. No.: 17/390,684

(22) Filed: Jul. 30, 2021

(65) Prior Publication Data
US 2022/0045259 A1 Feb. 10, 2022

(30) Foreign Application Priority Data
Aug. 6, 2020 (CN) .......................... 202010783265.9

(51) Int. Cl.
| H10N 60/80 | (2023.01) |
| H10N 60/12 | (2023.01) |
| H10N 60/85 | (2023.01) |
| H10N 60/01 | (2023.01) |

(52) U.S. Cl.
CPC ....... *H10N 60/805* (2023.02); *H10N 60/0912* (2023.02); *H10N 60/12* (2023.02); *H10N 60/85* (2023.02)

(58) Field of Classification Search
CPC ..... H10N 60/0912; H10N 60/12; H10N 60/85
See application file for complete search history.

(56) References Cited

U.S. PATENT DOCUMENTS

| 4,316,785 A | 2/1982 | Suzuki et al. |
| 4,412,902 A | 11/1983 | Michikami et al. |
| 6,541,789 B1 | 4/2003 | Sato et al. |
| 6,999,806 B2 | 2/2006 | Adachi et al. |

(Continued)

FOREIGN PATENT DOCUMENTS

| CN | 1113350 A | 12/1995 |
| CN | 1156338 A | 8/1997 |

(Continued)

OTHER PUBLICATIONS

PCT International Search Report and Written Opinion dated Nov. 9, 2021, issued in corresponding International Application No. PCT/US2021/044157 (10 pgs.).

(Continued)

*Primary Examiner* — Matthew L Reames
(74) *Attorney, Agent, or Firm* — Finnegan, Henderson, Farabow, Garrett & Dunner, LLP

(57) ABSTRACT

A superconducting circuit having a Josephson junction includes a first electrode layer for signal transmission; a second electrode layer for signal transmission; and an insulating layer arranged between the first electrode layer and the second electrode layer to form a Josephson junction, wherein, the first electrode layer and the second electrode layer are composed of a preset material, the insulating layer is composed of a compound corresponding to the preset material, and the preset material includes a non-aluminum superconducting material to prolong a coherence time of superconducting qubits.

18 Claims, 12 Drawing Sheets

(56) References Cited

U.S. PATENT DOCUMENTS

| | | |
|---|---|---|
| 2003/0038286 A1 | 2/2003 | Van Duzer et al. |
| 2004/0077504 A1 | 4/2004 | Adachi et al. |
| 2005/0107261 A1 | 5/2005 | Cantor et al. |
| 2009/0057652 A1 | 3/2009 | Nevirkovets et al. |
| 2017/0033273 A1 | 2/2017 | Chang et al. |
| 2019/0044051 A1 | 2/2019 | Caudillo et al. |
| 2019/0273196 A1 | 9/2019 | Marcus et al. |
| 2019/0288176 A1 | 9/2019 | Yoscovits et al. |
| 2019/0363239 A1 | 11/2019 | Yoscovits et al. |
| 2020/0028064 A1 | 1/2020 | Chang et al. |

FOREIGN PATENT DOCUMENTS

| | | |
|---|---|---|
| CN | 104701451 A | 6/2015 |
| CN | 105428517 A | 3/2016 |
| CN | 106098926 A | 11/2016 |
| CN | 109273585 A | 1/2019 |
| CN | 111200056 A | 5/2020 |
| DE | 3018510 A1 | 11/1980 |
| JP | S646779 A | 1/1989 |
| JP | H0629585 A | 2/1994 |
| JP | 2006222314 A | 8/2006 |
| WO | WO 2018/160187 A1 | 9/2018 |

OTHER PUBLICATIONS

First Office Action issued in corresponding Chinese Application No. 202010783265.9 dated Dec. 23, 2021 (12 pages).

Lam et al., "Fabrication of Ta/Ta-oxide/Ta trilayer Josephson junctions," Nuclear Instruments and Methods in Physics Research, 559: pp. 474-476 (2006).

Supplemental Search Report issued in corresponding Chinese Application No. 202010783265.9 dated Feb. 18, 2022 (2 pages).

JOSEPHSON JUNCTION, JOSEPHSON JUNCTION PREPARATION METHOD AND APPARATUS, AND SUPERCONDUCTING CIRCUIT

CROSS-REFERENCE TO RELATED APPLICATIONS

The present disclosure claims benefits of and priority to Chinese patent application No. 202010783265.9, filed on Aug. 6, 2020, the content of which is incorporated herein by reference in its entirety.

TECHNICAL FIELD

The present disclosure relates to the field of superconducting technologies, and in particular, to a Josephson junction, a Josephson junction preparation method and apparatus, and a superconducting circuit.

BACKGROUND

A Josephson junction is also referred to as a superconducting tunnel junction and is generally a structure composed of two superconductors sandwiching a thin barrier layer (e.g., with a thickness being smaller than or equal to a coherence length of a Cooper electron pair). For example, a Josephson junction formed by a superconductor (S)-insulator (I)-superconductor (S) structure can be referred to as SIS.

In the field of superconducting technologies, preparing Josephson junctions with aluminum materials is widely used. However, aluminum materials only have a superconducting transition temperature of 1200 kelvin (K) and a superconducting energy gap of $3.4 \times 10^{-4}$ eV. Such a low superconducting transition temperature and superconducting energy gap can easily cause aluminum-based superconducting qubits to be injected by other quasi-particles, thereby shortening a coherence time of the aluminum-based superconducting qubits and reducing accuracy of superconducting qubit computing.

SUMMARY

The embodiments of present disclosure provide methods, apparatuses, and devices for Josephson junction preparation as well as a Josephson junction. In an aspect, a superconducting circuit having a Josephson junction is provided. The superconducting circuit includes: a first electrode layer for signal transmission; a second electrode layer for signal transmission; and an insulating layer arranged between the first electrode layer and the second electrode layer to form the Josephson junction, wherein, the first electrode layer and the second electrode layer are composed of a preset material, the insulating layer is composed of a compound corresponding to the preset material, and the preset material comprises a non-aluminum superconducting material to prolong a coherence time of superconducting qubits.

In another aspect, a method for Josephson junction preparation is provided. The method includes: acquiring a substrate structure; and forming a first electrode layer on the substrate structure, forming an insulating layer on the first electrode layer, and forming a second electrode layer on the insulating layer, wherein the first electrode layer and the second electrode layer are composed of a preset material, the insulating layer is composed of a compound corresponding to the preset material, and the preset material comprises a non-aluminum superconducting material to prolong a coherence time of superconducting qubits, and wherein an arrangement of the insulating layer between the first electrode layer and the second electrode layer forms a Josephson junction.

In yet another aspect, a circuit having a Josephson junction prepared by a method is provided. The method includes: acquiring a substrate structure; and forming a first electrode layer on the substrate structure, forming an insulating layer on the first electrode layer, and forming a second electrode layer on the insulating layer, wherein the first electrode layer and the second electrode layer are composed of a preset material, the insulating layer is composed of a compound corresponding to the preset material, and the preset material comprises a non-aluminum superconducting material to prolong a coherence time of superconducting qubits, and wherein an arrangement of the insulating layer between the first electrode layer and the second electrode layer forms the Josephson junction.

In yet another aspect, a superconducting circuit is provided. The superconducting circuit includes a Josephson junction used as a nonlinear inductance element. The Josephson junction is generated by a method. The method includes: acquiring a substrate structure; and forming a first electrode layer on the substrate structure, forming an insulating layer on the first electrode layer, and forming a second electrode layer on the insulating layer, wherein the first electrode layer and the second electrode layer are composed of a preset material, the insulating layer is composed of a compound corresponding to the preset material, and the preset material comprises a non-aluminum superconducting material to prolong a coherence time of superconducting qubits, and wherein an arrangement of the insulating layer between the first electrode layer and the second electrode layer forms the Josephson junction.

In yet another aspect, an apparatus for Josephson junction preparation is provided. The apparatus includes a memory configured to store a set of instructions and one or more processors communicatively coupled to the memory and configured to execute the set of instructions to cause the apparatus to perform a method. The method includes: acquiring a substrate structure; forming a first electrode layer on the substrate structure, forming an insulating layer on the first electrode layer, and forming a second electrode layer on the insulating layer, wherein the first electrode layer and the second electrode layer are composed of a preset material, the insulating layer is composed of a compound corresponding to the preset material, and the preset material comprises a non-aluminum superconducting material to prolong a coherence time of superconducting qubits; and determining a structure formed by the first electrode layer, the insulating layer, and the second electrode layer as a Josephson junction.

In yet another aspect, a device including a superconducting circuit is provided. The superconducting circuit includes a Josephson junction. the Josephson junction includes a first electrode layer for signal transmission; a second electrode layer for signal transmission; and an insulating layer arranged between the first electrode layer and the second electrode layer to form the Josephson junction, wherein, the first electrode layer and the second electrode layer are composed of a preset material, the insulating layer is composed of a compound corresponding to the preset material, and the preset material includes a non-aluminum superconducting material to prolong a coherence time of superconducting qubits.

BRIEF DESCRIPTION OF THE DRAWINGS

To describe the technical solutions in the embodiments of the present disclosure more clearly, the accompanying drawings required for describing the embodiments are briefly introduced below. It is apparent that the accompanying drawings described in the following are merely some embodiments of the present disclosure, and those of ordinary skill in the art can still derive other drawings from these accompanying drawings without creative efforts.

DETAILED DESCRIPTION

Figure 1:
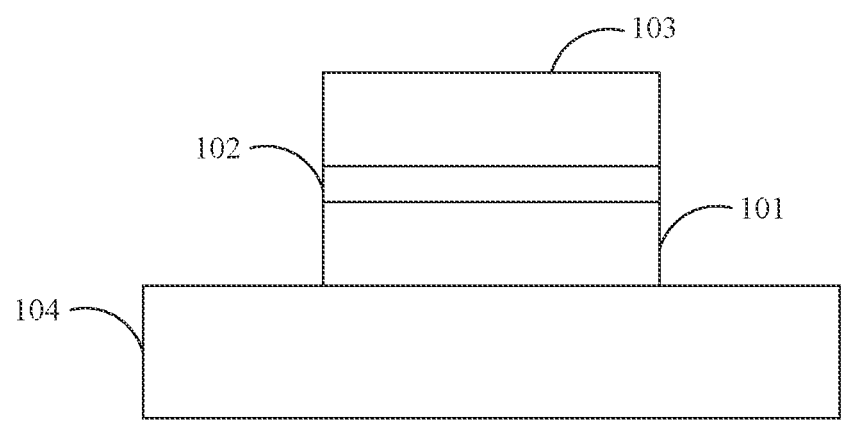
FIG. 1 is a first schematic structural diagram illustrating an example Josephson junction, consistent with some embodiments of the present disclosure.

Reference can now be made in detail to example embodiments, examples of which are illustrated in the accompanying drawings. The following description refers to the accompanying drawings in which the same numbers in different drawings represent the same or similar elements unless otherwise represented. The implementations set forth in the following description of example embodiments do not represent all implementations consistent with the disclosure. Instead, they are merely examples of apparatuses and methods consistent with aspects related to the disclosure as recited in the appended claims. Particular aspects of present disclosure are described in greater detail below. The terms and definitions provided herein control, if in conflict with terms and/or definitions incorporated by reference.

The terminology used in the embodiments of the present disclosure is for the purpose of describing particular embodiments only, and is not intended to limit the present disclosure. The singular forms "a," "said," and "the" used in the embodiments of the present disclosure and the appended claims are also intended to include plural forms, unless other meanings are clearly indicated in the context, and "multiple" generally includes at least two, but does not exclude the case of including at least one.

It should be noted that, the relational terms herein such as "first" and "second" are used only to differentiate an entity or operation from another entity or operation, and do not require or imply any actual relationship or sequence between these entities or operations. Moreover, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items.

As used herein, unless specifically stated otherwise, the term "or" encompasses all possible combinations, except where infeasible. For example, if it is stated that a component can include A or B, then, unless specifically stated otherwise or infeasible, the component can include A, or B, or A and B. As a second example, if it is stated that a component can include A, B, or C, then, unless specifically stated otherwise or infeasible, the component can include A, or B, or C, or A and B, or A and C, or B and C, or A and B and C.

Depending on the context, the words "in case of" and "if" as used herein can be interpreted as "at the time of" or "when" or "in response to determination" or "in response to detection." Similarly, depending on the context, the phrase "if determined" or "if detected (a stated condition or event)" can be interpreted as "when determined" or "in response to determination" or "when detected (a stated condition or event)" or "response to detection (of a stated condition or event)."

It should be further noted that the terms "include," "comprise," or any other variations thereof are intended to cover non-exclusive inclusion, so that a commodity or system including a series of elements not only includes the elements, but also includes other elements not explicitly listed, or further includes elements inherent to the commodity or system. In the absence of more limitations, an element defined by "including a/an . . . " does not exclude that the commodity or system including the element further has other identical elements. In addition, the sequence of steps in the following method embodiments is only an example, not a strict limitation.

A Josephson junction, as used herein, refers to a sandwich structure (e.g., a superconductor-insulator-superconductor structure or "S-I-S" structure for simplicity) with two layers of superconducting materials separated by a thin insulator (e.g., a dielectric layer of a few nanometers). The electrical properties of a Josephson junction at low temperatures can be a non-linear inductance element that can be used for preparing superconducting qubits. Generally, reliable production of Josephson junctions is important to the application and development of superconducting quantum circuits.

A Josephson effect, as used herein, is related to a super current phenomenon across multiple Josephson junctions. Among the multiple Josephson junction, each Josephson junction can have a critical current. The magnitude of the critical current can be related to an electronic energy band structure or other factors. If a current flowing through a Josephson junction is less than the critical current, there can be no voltage drop on the Josephson junction. In such cases, a Josephson effect occurs, which can refer to an effect of no current loss when a current signal is transmitted through the Josephson junction within a preset current range.

A quantum computer, as used herein, refers to a device that uses quantum logic to perform general-purpose or specific-purpose computing. Different from electronic computers (e.g., traditional computers), a quantum computer uses qubits for storing data and uses a quantum algorithm to perform data operations.

A two-energy-level system (or "two-level system"), as used herein, refers to a system where there are only two energy levels involved in the operation of a laser. An effective excitation means can pump as many atoms in a lower energy level ("E1") to an upper energy level ("E2") as possible. Such a structure as described above can be referred to as a two-level system.

Typically, a Josephson junction is a basic element used to realize one or more superconducting qubits, which can be is the core technology of a superconducting quantum computer. Moreover, quality of the Josephson junction (e.g., the quality being related to a structure of the Josephson junction, a degree of oxidation, an environment, or other factors) can be an important factor in the performance of qubits, and thus can have a direct impact on computational potential of the superconducting quantum computer.

In some embodiments, a Josephson junction can be composed of two superconducting electrodes separated by a thin insulating layer (or referred to as a "tunnel barrier"). In such cases, improving the quality of the Josephson junction can be implemented mainly by relying on material engineering and manufacturing technology. In the field of superconducting technologies, Josephson junctions prepared by aluminum materials are widely used. However, Josephson junctions prepared by aluminum materials can have several challenges.

For example, a single crystal aluminum can be used as the insulating layer. By way of example, the insulating layer can be composed of amorphous or polycrystalline $AlO_x$. A complex structure composing such an insulating layer can often have defects in its lattice structure, and such defects can cause large energy lost. For example, crystal structure defects can be formed because ions or atoms are not bound by crystal lattice. The unbound ions or atoms can consume energy when oscillating along with the current. Also, ion spin or ion self-vibration can also consume energy.

Further, aluminum materials can only have a superconducting transition temperature of 1200 kelvin (K) and a superconducting energy gap of $3.4 \times 10^{-4}$ eV. Such a low superconducting transition temperature and superconducting energy gap can easily cause aluminum-based superconducting qubits to be injected by other quasi-particles. A coherence time of the aluminum-based superconducting qubits can be shortened, and accuracy of superconducting qubit computing can be reduced.

In some embodiments, in superconducting qubits, the two-level-energy system can exist in amorphous dielectric materials. For example, a Josephson junction based on $Al/AlO_x/Al$ or $Nb/Al/AlO_x/Nb$ can include multiple two-level-energy systems between a substrate and a metal, between the metal and vacuum, between the substrate and a vacuum interface, or within an $AlO_x$ interface. Because the two-level-energy system can reduce the coherence time of the system, for example, for the Josephson junction composed of $Al/AlO_x/Al$ or $Nb/Al/AlO_x/Nb$, the coherence time of superconducting qubits can be generally below 100 microseconds (µs) due to the existence of the two-level-energy systems.

In order to reduce the impact of the two-level system on the coherence time of superconducting qubits, the existing related technology proposes a technical solution that replaces the amorphous barrier $AlO_x$ with a single crystal barrier $Al_2O_3$, which can reduce the energy consumed by the two-level-energy system. For example, the existing solution can reduce the energy loss by about 20%. However, when the single crystal barrier $Al_2O_3$ is used to replace the amorphous barrier $AlO_x$, the use of single crystal $Al_2O_3$ as an insulating layer can be restricted due to the problem of material compatibility, and therefore, the quality of the generated Josephson junction can be difficult to guarantee.

In order to solve the above technical problems, a Josephson junction, a Josephson junction preparation method and apparatus, and a superconducting circuit are provided in the present embodiment. A Josephson junction disclosed herein can be composed of a first electrode layer, a second electrode layer, and an insulating layer arranged between the first electrode layer and the second electrode layer. For example, the first electrode layer and the second electrode layer can be composed of a non-aluminum superconducting material, and the insulating layer can be composed of an oxide corresponding to the preset material, thereby realizing the formation of the Josephson junction by non-aluminum materials. Moreover, the non-aluminum superconducting material can have a stable lattice structure, and thus energy consumption due to defects of the lattice structure can be reduced or avoided effectively. In addition, the Josephson junction disclosed herein can be prepared by using the non-aluminum superconducting material, and the non-aluminum superconducting material can prolong the coherence time of superconducting qubits. Therefore, the accuracy of superconducting qubit computing and the quality and efficiency of the prepared Josephson junction can be improved.

Some implementations of the present disclosure can be described in detail below with reference to the accompanying drawings. It is noted that the embodiments and features in the embodiments as disclosed herein can be combined with each other.

FIG. 1 is a first schematic structural diagram illustrating an example Josephson junction 100, consistent with some embodiments of the present disclosure. Josephson junction 100 can be a basic element used to realize superconducting qubits. For example, Josephson junction 100 can be prepared by overlapping junction technology. As shown in FIG. 1, Josephson junction 100 can include a first electrode layer 101, a second electrode layer 103, and an insulating layer 102. First electrode layer 101 and second electrode layer 103 can be used for signal transmission. Insulating layer 102 is arranged between first electrode layer 101 and second electrode layer 103 to form Josephson junction 100. First electrode layer 101 and second electrode layer 103 can be composed of a preset material, and insulating layer 102 can be composed of a compound (e.g., a compound having an insulating feature) corresponding to the preset material. By way of example, the preset material can include a non-aluminum superconducting material for prolonging a coherence time of superconducting qubits.

First electrode layer 101 can be arranged on a preset substrate 104, and preset substrate 104 can be used to carry Josephson junction 100. In some embodiments, the non-aluminum superconducting material used to generate first electrode layer 101 and second electrode layer 103 can include at least one of tantalum, molybdenum, or vanadium.

In some embodiments, the non-aluminum superconducting material for forming first electrode layer 101 and second electrode layer 103 can include tantalum, and the compound corresponding to the preset material can include tantalum oxide. For example, first electrode layer 101 and second electrode layer 103 can be composed of a tantalum material Ta, and insulating layer 102 can be composed of a tantalum oxide $TaO_x$. In some embodiments, the above tantalum oxide $TaO_x$ material can include any at least one of a tantalum monoxide TaO material, a tantalum dioxide $TaO_2$ material, a tantalum trioxide $TaO_3$ material, a tantalum tetraoxide $TaO_4$, a tantalum pentoxide $Ta_2O_4$ material, or any other tantalum oxide materials. Different tantalum oxide materials can be selected to form insulating layer 102 based on specific application requirements, which is not limited to the examples disclosed herein.

In some embodiments, the compound corresponding to the preset material can include tantalum nitride. For example, first electrode layer 101 and second electrode layer 103 can be composed of a tantalum material Ta, and insulating layer 102 can be composed of a tantalum nitride $TaN_x$. In some embodiments, the tantalum nitride TaN material can include at least one of a tantalum mononitride TaN material, a tantalum dinitride $TaN_2$ material, a tantalum trinitride $TaN_3$ material, a tantalum tetranitride $TaN_4$ material, or any other tantalum nitride materials. Different tantalum nitride materials can be selected to form insulating layer 102 based on specific application requirements, which is not limited to the examples disclosed herein.

In some embodiments, the non-aluminum superconducting material can include molybdenum, and the compound corresponding to the preset material includes molybdenum oxide. For example, first electrode layer 101 and second electrode layer 103 can be composed of a molybdenum material Mo, and insulating layer 102 can be composed of a molybdenum oxide $MoO_x$. In some embodiments, the above molybdenum oxide $MoO_x$ material can include at least one of a molybdenum monoxide MoO material, a molybdenum dioxide $MoO_2$ material, a molybdenum trioxide $MoO_3$ material, a molybdenum tetraoxide $MoO_4$ material, or any other molybdenum oxide materials. Different molybdenum oxide materials can be selected to form insulating layer 102 based on specific application requirements, which is not limited to the examples disclosed herein.

In some embodiments, the compound corresponding to the preset material can include molybdenum nitride. For example, first electrode layer 101 and second electrode layer 103 can be composed of a molybdenum material Mo, and insulating layer 102 can be composed of a molybdenum nitride $MoN_x$. In some embodiments, the molybdenum nitride MoN material can include at least one of a molybdenum mononitride MoN material, a molybdenum dinitride $MoN_2$ material, a molybdenum trinitride $MoN_3$ material, a molybdenum tetranitride $MoN_4$ material, or any other molybdenum nitride materials. Different molybdenum nitride materials can be selected to form insulating layer 102 based on specific application requirements, which is not limited to the examples disclosed herein.

In some embodiments, the non-aluminum superconducting material can include vanadium, and the compound corresponding to the preset material can include vanadium oxide. For example, first electrode layer 101 and second electrode layer 103 can be composed of a vanadium material V, and insulating layer 102 can be composed of a vanadium oxide $VO_x$. In some embodiments, the above vanadium oxide $VO_x$ material can include at least one of a vanadium monoxide VO material, a vanadium dioxide $VO_2$ material, a vanadium trioxide $VO_3$ material, a vanadium tetraoxide $VO_4$ material, or any other vanadium oxide materials. Those skilled in the art can select different vanadium oxide materials to form insulating layer 102 based on specific application requirements, which is not limited to the examples disclosed herein.

In some embodiments, the compound corresponding to the preset material can include vanadium nitride. For example, first electrode layer 101 and second electrode layer 103 can be composed of a vanadium material V, and insulating layer 102 can be composed of a vanadium nitride $VN_x$. In some embodiments, the vanadium nitride $VN_x$ material can include at least one of a vanadium mononitride VN material, a vanadium dinitride $VN_2$ material, a vanadium trinitride $VN_3$ material, a vanadium tetranitride $VN_4$ material, or any other vanadium nitride materials. Different vanadium nitride materials can be selected to form insulating layer 102 based on specific application requirements, which is not limited to the examples disclosed herein.

By way of example, with reference to FIG. 1, a Josephson junction disclosed herein can be composed of first electrode layer 101, second electrode layer 103, and insulating layer 102 arranged between first electrode layer 101 and second electrode layer 103. For example, first electrode layer 101 and second electrode layer 103 can be composed of a non-aluminum superconducting material, and insulating layer 102 can be composed of an oxide corresponding to the preset material, thereby forming the Josephson junction by non-aluminum materials. Moreover, the non-aluminum superconducting material can have a stable lattice structure, and thus energy consumption due to defects of the lattice structure can be reduced or avoided effectively. In addition, the Josephson junction can be prepared by using the non-aluminum superconducting material, and the non-aluminum superconducting material can prolong the coherence time of superconducting qubits. By doing so, the accuracy of superconducting qubit computing and the quality and efficiency of the prepared Josephson junction can be improved.

Figure 2:
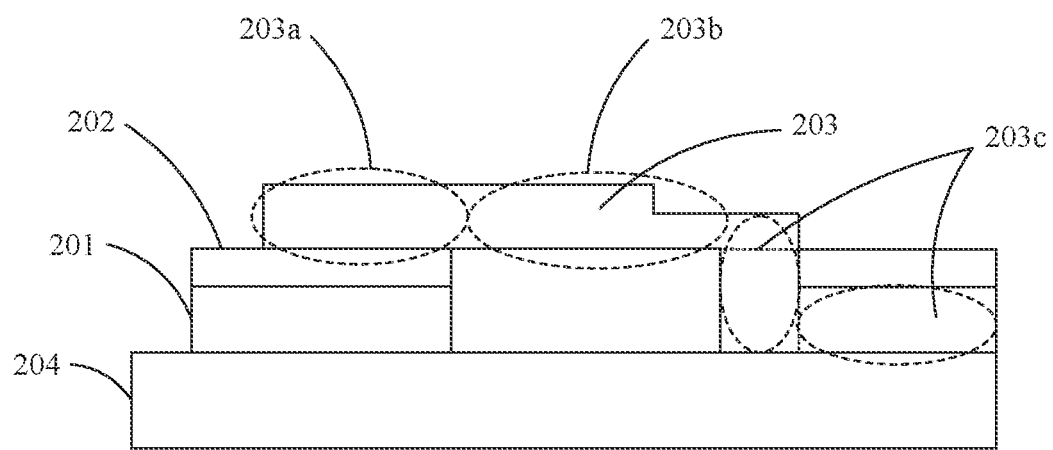
FIG. 2 is a second schematic structural diagram illustrating another example Josephson junction, consistent with some embodiments of the present disclosure.

FIG. 2 is a second schematic structural diagram illustrating another example Josephson junction 200, consistent with some embodiments of the present disclosure. By way of example, with reference to FIG. 2, the Josephson junction in the present disclosure can be prepared and generated by using three-layer junction technology. As shown in FIG. 2, a first electrode layer 201 used to form Josephson junction 200 can be arranged on a preset substrate 204, and a second electrode layer 203 can be a bridge structure with a first end arranged on an insulating layer 202 and a second end arranged on preset substrate 204.

In FIG. 2, second electrode layer 203 includes a first sub-electrode portion 203a located at an upper end of a part of insulating layer 202, a second sub-electrode portion 203b connected to first sub-electrode portion 203a, and a third sub-electrode portion 203c connected to second sub-electrode portion 203b. There is a preset distance between second sub-electrode portion 203b and preset substrate 204 (e.g., a preset gap being formed between second sub-electrode portion 203b and preset substrate 204), and a third sub-electrode portion 203c can be arranged on preset substrate 204. By doing so, second electrode layer 203 of the bridge structure composed of first sub-electrode portion 203a, second sub-electrode portion 203b, and third sub-electrode portion 203c can be obtained. It should be noted that Josephson junction 200 can have an overlapping structure composed of first sub-electrode portion 203a, as well as insulating layer 202 and first electrode layer 201 that are located at the lower end of first sub-electrode portion 203a.

By generating the Josephson junction in the present embodiment using the three-layer junction technology, not only the quality and efficiency of the preparation of the Josephson junction can be ensured, but also the flexibility and selectivity of the preparation of the Josephson junction can be expanded. By doing so, a user can be facilitated to choose different preparation methods to prepare Josephson junctions with different structures based on different application scenarios, the stability and reliability of the preparation of Josephson junctions can be further improved.

Figure 3:
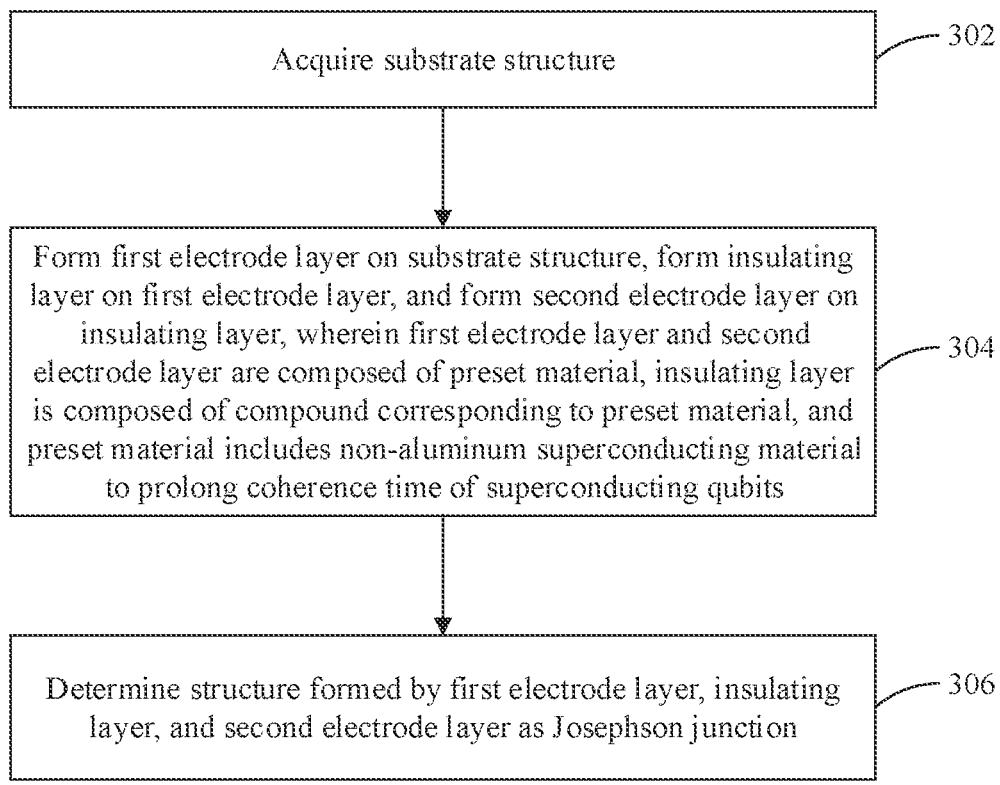
FIG. 3 is a flowchart of an example method for Josephson junction preparation, consistent with some embodiments of the present disclosure.

FIG. 3 is a flowchart of an example method 300 for Josephson junction preparation, consistent with some embodiments of the present disclosure. Method 300 can be used to prepare a Josephson junction. In some embodiments, Josephson junctions with different structures can have different preparation methods correspondingly.

At step 302, a substrate structure can be acquired. The substrate structure can be used to carry the generated Josephson junction. The specific material of the substrate structure is not limited in the present embodiment, and accordingly can be set based on specific application requirements and design requirements, as long as it can be ensured that the substrate structure and the non-aluminum superconducting material used to prepare the Josephson junction do not undergo a combination reaction.

At step 304, a first electrode layer can be formed on the substrate structure, an insulating layer can be formed on the first electrode layer, and a second electrode layer can be formed on the insulating layer. The first electrode layer and the second electrode layer can be composed of a preset material. The insulating layer can be composed of a compound corresponding to the preset material. The preset material can include a non-aluminum superconducting material to prolong a coherence time of superconducting qubits.

In some embodiments, after the substrate structure is acquired at step 302, to form the Josephson junction, the first electrode layer can be formed on the substrate structure, then the insulating layer can be formed on the first electrode layer, and the second electrode layer can be formed on the insulating layer. The non-aluminum superconducting material used to generate the first electrode layer and the second electrode layer can include at least one of tantalum, molybdenum, or vanadium. In some embodiments, the non-aluminum superconducting material can include tantalum, and the compound corresponding to the preset material can include tantalum oxide. For example, the first electrode layer and the second electrode layer can be composed of a tantalum material Ta, and the insulating layer can be composed of a tantalum oxide $TaO_x$. In some embodiments, the tantalum oxide $TaO_x$ material can include at least one of a tantalum monoxide TaO material, a tantalum dioxide $TaO_2$ material, a tantalum trioxide $TaO_3$ material, a tantalum tetraoxide $TaO_4$ material, or any other tantalum oxide materials. Different tantalum oxide materials can be selected to form the insulating layer based on specific application requirements, which is not limited to the examples disclosed herein.

In some embodiments, the compound corresponding to the preset material can include tantalum nitride. For example, the first electrode layer and the second electrode layer can be composed of a tantalum material Ta, and the insulating layer can be composed of a tantalum nitride $TaN_x$. In some embodiments, the tantalum nitride TaN material can include at least one of a tantalum mononitride TaN material, a tantalum dinitride $TaN_2$ material, a tantalum trinitride $TaN_3$ material, a tantalum tetranitride $TaN_4$ material, or any other tantalum nitride materials. Different tantalum nitride materials can be selected to form the insulating layer based on specific application requirements, which is not limited to the examples disclosed herein.

In some embodiments, the non-aluminum superconducting material can include molybdenum, and the compound corresponding to the preset material can include molybdenum oxide. For example, the first electrode layer and the second electrode layer can be composed of a molybdenum material Mo, and the insulating layer can be composed of a molybdenum oxide $MoO_x$. In some embodiments, the molybdenum oxide $MoO_x$ material can include at least one of a molybdenum monoxide MoO material, a molybdenum dioxide $MoO_2$ material, a molybdenum trioxide $MoO_3$ material, a molybdenum tetraoxide $MoO_4$ material, or any other molybdenum oxide materials. Different molybdenum oxide materials can be selected to form the insulating layer based on specific application requirements, which is not limited to the examples disclosed herein.

In some embodiments, the compound corresponding to the preset material can include molybdenum nitride. For example, the first electrode layer and the second electrode layer can be composed of a molybdenum material Mo, and the insulating layer can be composed of a molybdenum nitride $MoN_x$. In some embodiments, the molybdenum nitride MoN material can include at least one of a molybdenum mononitride MoN material, a molybdenum dinitride $MoN_2$ material, a molybdenum trinitride $MoN_3$ material, a molybdenum tetranitride $MoN_4$ material, or any other molybdenum nitride. Different molybdenum nitride materials can be selected to form the insulating layer based on specific application requirements, which is not limited to the examples disclosed herein.

In some embodiments, the non-aluminum superconducting material can include vanadium, and the compound corresponding to the preset material can include vanadium oxide. For example, the first electrode layer and the second electrode layer can be composed of a vanadium material V, and the insulating layer can be composed of a vanadium oxide $VO_x$. In some embodiments, the vanadium oxide $VO_x$ material can include at least one of a vanadium monoxide VO material, a vanadium dioxide $VO_2$ material, a vanadium trioxide $VO_3$ material, a vanadium tetraoxide $VO_4$ material, or any other vanadium oxide materials. Different vanadium oxide materials can be selected to form the insulating layer based on specific application requirements, which is not limited to the examples disclosed herein.

In some embodiments, the compound corresponding to the preset material can include vanadium nitride. For example, the first electrode layer and the second electrode layer can be composed of a vanadium material V, and the insulating layer can be composed of a vanadium nitride $VN_x$. In some embodiments, the vanadium nitride $VN_x$ material can include at least one of a vanadium mononitride VN material, a vanadium dinitride $VN_2$ material, a vanadium trinitride $VN_3$ material, a vanadium tetranitride $VN_4$ material, or any other vanadium nitride materials. Different vanadium nitride materials can be selected to form the insulating layer based on specific application requirements, which is not limited to the examples disclosed herein.

Still referring to FIG. 3, at step 306, a structure formed by the first electrode layer, the insulating layer, and the second electrode layer can be determined as a Josephson junction. For example, after the first electrode layer, the insulating layer, and the second electrode layer are generated, an overlapping structure formed by the first electrode layer, the insulating layer, and the second electrode layer can be determined as the Josephson junction.

Consistent with some embodiments of this disclosure, the Josephson junction preparation method based on the present embodiment can involve acquiring the substrate structure, then forming the first electrode layer on the substrate structure, forming the insulating layer on the first electrode layer, and forming the second electrode layer on the insulating layer, and then determining the overlapping structure formed by the first electrode layer, the insulating layer, and the second electrode layer as the Josephson junction. The first electrode layer and the second electrode layer can be composed of a non-aluminum superconducting material. The insulating layer can be composed of an oxide corresponding to the preset material, thereby realizing forming the Josephson junction by non-aluminum materials. Moreover, the non-aluminum superconducting material can have a stable lattice structure, and thus energy consumption due to defects of the lattice structure can be reduced or avoided effectively. In addition, the non-aluminum superconducting material can effectively prolong the coherence time of superconducting qubits. Therefore, the accuracy of superconducting qubit computing, the quality and efficiency of the Josephson junction prepared by using the method, and the practicability of the method can be improved.

Figure 4:
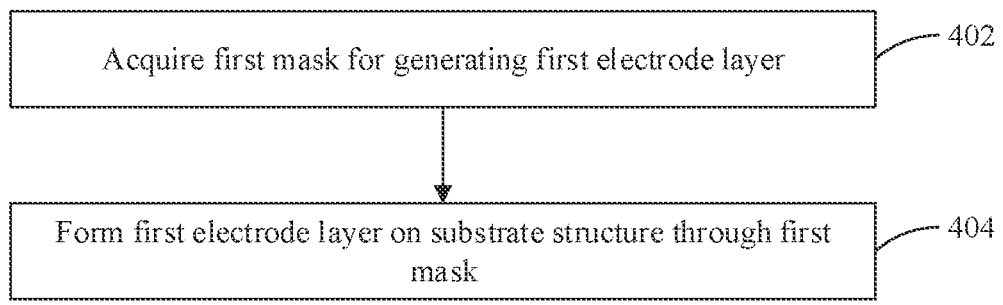
FIG. 4 is a flowchart of an example method for forming a first electrode layer on a substrate structure, consistent with some embodiments of the present disclosure.

FIG. 4 is a flowchart of an example method 400 for forming a first electrode layer on a substrate structure, consistent with some embodiments of the present disclosure. It should be noted that methods (e.g., including method 400) of forming the first electrode layer is not limited in the present embodiment, and can be set based on specific application requirements and design requirements.

In FIG. 4, at step 402, a first mask for generating a first electrode layer can be acquired. At step 404, a first electrode layer is formed on the substrate structure through the first mask.

In some embodiments, the first mask can be provided with a pattern for generating the first electrode layer. For example, the first mask can include a first sub-mask portion provided on one side of an upper end of the substrate structure and a second sub-mask portion provided on the other side of the upper end of the substrate structure. A preset gap can exist between the first sub-mask portion and the second sub-mask portion.

In some embodiments, after the first mask is acquired, the first mask can be arranged on the substrate structure, and then a material deposition process can be performed on the substrate structure provided with the first mask. By doing so, the first electrode layer can be formed on the substrate structure through the first mask, thus ensuring the quality and efficiency of the generation of the first electrode layer.

Figure 5:
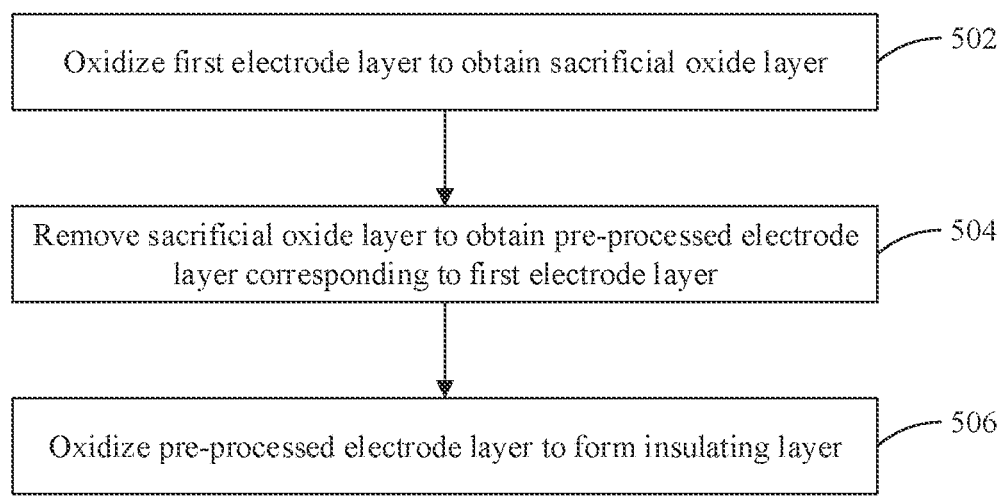
FIG. 5 is a flowchart of an example method for forming an insulating layer on the first electrode layer in FIG. 4, consistent with some embodiments of the present disclosure.

FIG. 5 is a flowchart of an example method 500 for forming an insulating layer on the first electrode layer in FIG. 4, consistent with some embodiments of the present disclosure. With reference to FIG. 5, after the first electrode layer is generated, an insulating layer can be formed on the first electrode layer.

At step 502, the first electrode layer can be oxidized to obtain a sacrificial oxide layer. At step 504, the sacrificial oxide layer can be removed to obtain a pre-processed electrode layer corresponding to the first electrode layer. At step 506, the pre-processed electrode layer can be oxidized to form an insulating layer.

In some embodiments, after the first electrode layer is generated, to ensure the quality of forming the insulating layer located at the upper end of the first electrode layer, the first electrode layer can be oxidized to obtain the sacrificial oxide layer. After the sacrificial oxide layer is acquired, the sacrificial oxide layer can be removed to obtain the pre-processed electrode layer that does not contain impurities or contains a relatively small proportion of impurities. The pre-processed electrode layer can correspond to the first electrode layer. For example, the pre-processed electrode layer and the first electrode layer can be both composed of a non-aluminum superconducting material.

In some embodiments, removing the sacrificial oxide layer to obtain the pre-processed electrode layer corresponding to the first electrode layer can include: cleaning the sacrificial oxide layer by using a cleaning solution to obtain the pre-processed electrode layer.

The first electrode layer and the pre-processed electrode layer are composed of the non-aluminum superconducting material, and the above material can withstand the cleaning operation by using a cleaning solution with high cleaning efficiency; therefore, pollution exists in the nano-processing process can be removed, thus effectively improving the quality and efficiency of cleaning the sacrificial oxide layer. For example, the cleaning solution can include at least one of the following: a hydrofluoric acid solution and a buffered oxide etchant. In some embodiments, the specific type of the cleaning solution is not limited to the type defined above, and those skilled in the art can choose the cleaning solution based on the specific application requirements and design requirements, as long as the quality of cleaning the sacrificial oxide layer by using the cleaning solution can be ensured, thereby improving the quality and efficiency of acquiring the pre-processed electrode layer.

In some embodiments, after the pre-processed electrode layer is acquired, the pre-processed electrode layer can be oxidized, so that an insulating layer with a better quality can be generated, which can further improve the quality and efficiency of preparing the Josephson junction based on the insulating layer.

Figure 6:
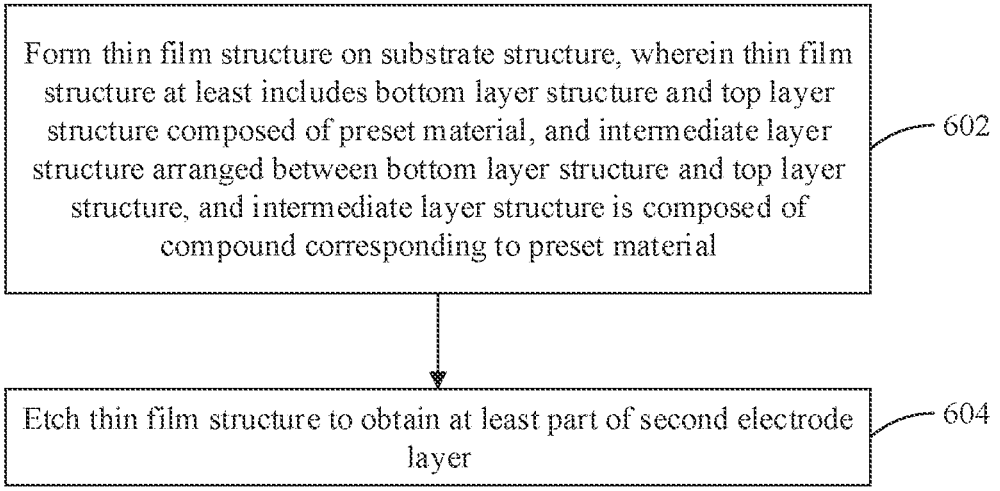
FIG. 6 is a flowchart of an example method for forming a second electrode layer on the insulating layer in FIG. 5, consistent with some embodiments of the present disclosure.

FIG. 6 is a flowchart of an example method 600 for forming a second electrode layer on the insulating layer in FIG. 5, consistent with some embodiments of the present disclosure. With reference to FIG. 6, when the prepared Josephson junction has a three-layer junction structure, forming a second electrode layer on the insulating layer can include the following steps.

At step 602, a thin film structure can be formed on the substrate structure. The thin film structure can include a bottom layer structure and a top layer structure composed of a preset material, and an intermediate layer structure arranged between the bottom layer structure and the top layer structure. The intermediate layer structure can be composed of a compound corresponding to the preset material.

In some embodiments, the bottom layer structure included in the substrate structure can be used to generate a first electrode layer arranged on the substrate structure. The intermediate layer structure can be used to generate an insulating layer arranged on the substrate structure, and the top layer structure can be used to generate a second electrode layer arranged on the substrate structure. Therefore, the bottom layer structure and the top layer structure can be composed of a non-aluminum preset material, and the intermediate layer structure can be composed of a compound corresponding to the preset material. For example, the non-aluminum superconducting material can include at least one of tantalum, molybdenum, or vanadium.

At step 604, the thin film structure can be etched to obtain at least a part of the second electrode layer. In some embodiments, after a thin film structure is formed on the substrate structure, the thin film structure can be etched so that at least a part of the second electrode layer can be obtained.

Figure 7:
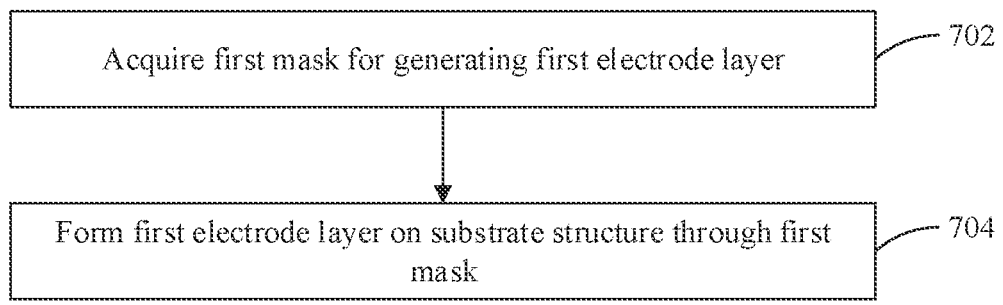
FIG. 7 is a flowchart of an example method for etching a thin film structure to obtain at least a part of the second electrode layer in FIG. 6, consistent with some embodiments of the present disclosure.

FIG. 7 is a flowchart of an example method 700 for etching a thin film structure to obtain at least a part of the second electrode layer in FIG. 6, consistent with some embodiments of the present disclosure. With reference to FIG. 7, etching the thin film structure to obtain at least a part of the second electrode layer can include the following steps.

At step 702, a second mask for generating a first sub-electrode portion is acquired, and the first sub-electrode portion is at least a part of the second electrode layer.

The second mask is provided with a pattern for generating the first sub-electrode portion. For example, the specific structure of the second mask is not limited in the present embodiment, and can be set by those skilled in the art based on specific application requirements and designs. For example, the second mask can be a rectangular template structure, a square template structure, or the like. Of course, those skilled in the art can set the specific shape and structure of the second mask based on specific application requirements and design requirements, as long as the quality of generating the first sub-electrode portion can be ensured, which is not limited to the examples disclosed herein.

At step 704, the thin film structure can be etched based on the second mask to obtain the first sub-electrode portion. In some embodiments, after the second mask is acquired, the second mask can be placed on the thin film structure, and then the thin film structure can be etched through the second mask to obtain the first sub-electrode portion. By doing so, the quality and efficiency of the generation of the first sub-electrode portion can be ensured. It can be understood that the first sub-electrode part can be a part of the top layer structure.

Figure 8:
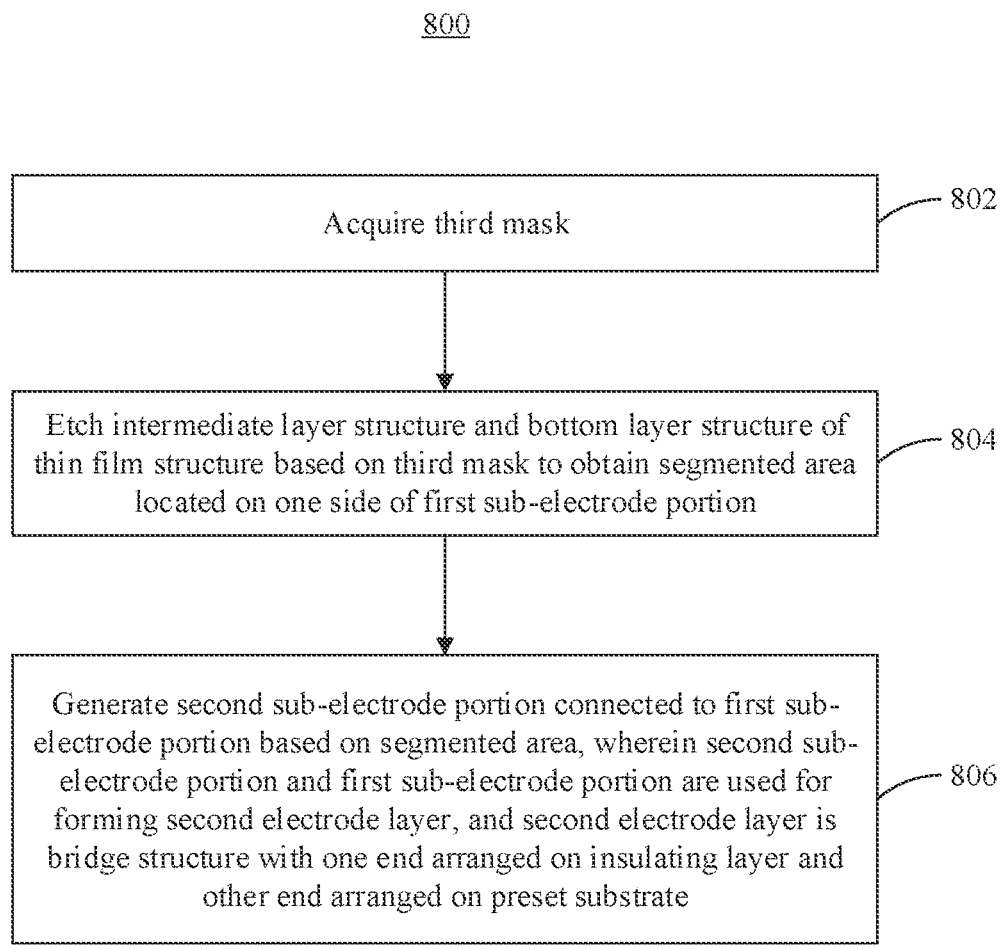
FIG. 8 is a flowchart of another example method for Josephson junction preparation, consistent with some embodiments of the present disclosure.

FIG. 8 is a flowchart of another example method 800 for Josephson junction preparation, consistent with some embodiments of the present disclosure. With reference to FIG. 8, after the first sub-electrode portion is obtained, method 800 can also include the following steps.

At step 802, a third mask can be acquired. The third mask can be provided with a pattern for generating a second sub-electrode portion, and there can be one or more third masks. When there are multiple third masks, it can indicate that multiple etching and deposition operations can be performed through the multiple third masks to obtain the second sub-electrode portion. Then, a second electrode layer with a bridge structure can be generated through the first sub-electrode portion and the second sub-electrode portion.

At step 804, the intermediate layer structure and the bottom layer structure of the thin film structure can be etched based on the third mask to obtain a segmented area on one side of the first sub-electrode portion. In some embodiments, after the third mask is acquired, the third mask can be arranged on the substrate structure on which the first sub-electrode portion is generated. Then the substrate structure provided with the third mask can be etched, so as to obtain the segmented area located on one side of the first sub-electrode portion.

At step 806, a second sub-electrode portion connected to the first sub-electrode portion can be generated based on the segmented area. The second sub-electrode portion and the first sub-electrode portion can be used to form a second electrode layer. The second electrode layer can be a bridge structure with a first end arranged on the insulating layer and a second end arranged on the preset substrate.

In some embodiments, after the segmented area is acquired, a second sub-electrode portion connected to the first sub-electrode portion can be generated based on the segmented area. The second sub-electrode portion and the first sub-electrode portion can be used to form the second electrode layer. The generated second electrode layer can be a bridge structure with a first end end arranged on the insulating layer and a second end arranged on the preset substrate. It should be noted that the implementations of generating the second sub-electrode portion connected to the first sub-electrode portion based on the segmented area are not limited in the present disclosure, and can be set based on specific application requirements and design requirements.

Figure 9:
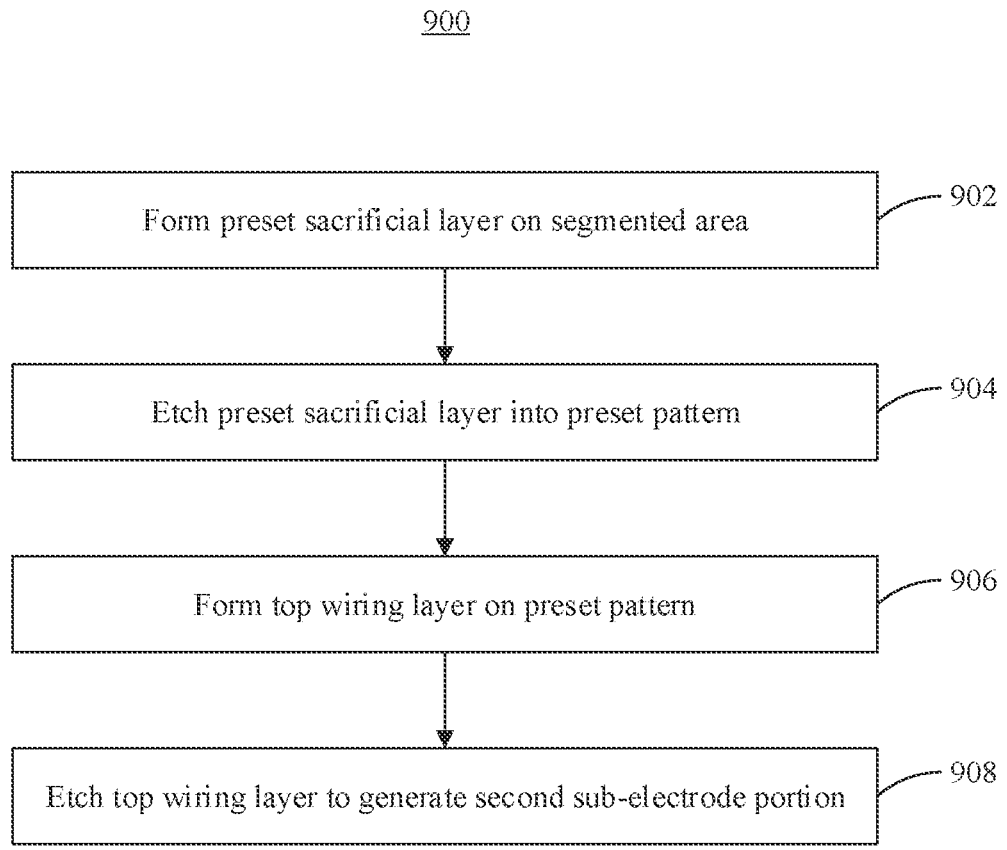
FIG. 9 is a flowchart of an example method for generating a second sub-electrode portion connected to a first sub-electrode portion based on segmented area, consistent with some embodiments of the present disclosure.

FIG. 9 is a flowchart of an example method 900 for generating a second sub-electrode portion connected to a first sub-electrode portion based on segmented area, consistent with some embodiments of the present disclosure. As shown in FIG. 9, generating the second sub-electrode portion connected to the first sub-electrode portion based on the segmented area can include the following steps.

At step 902, a preset sacrificial layer can be formed on the segmented area. At step 904, the preset sacrificial layer can be etched into a preset pattern. At step 906, a top wiring layer can be formed on the preset pattern. At step 908, the top wiring layer can be etched to generate the second sub-electrode portion.

In some embodiments, after the segmented area is acquired, a preset sacrificial layer can be formed on the segmented area. The preset sacrificial layer can be composed of a non-aluminum superconducting material. After the preset sacrificial layer is acquired, the preset sacrificial layer can be etched into a preset pattern. For example, a fourth mask for generating the preset pattern can be obtained. The fourth mask can be arranged on an upper end of the preset sacrificial layer. Then, the preset sacrificial layer can be etched through the fourth mask to generate the preset pattern.

In some embodiments, after the preset pattern is acquired, a top wiring layer can be formed on the preset pattern. The top wiring layer can be used to generate the second sub-electrode portion. Therefore, the top wiring layer can be composed of the non-aluminum superconducting material. After the top wiring layer is generated, the top wiring layer can be etched. For example, a fifth mask for generating the second sub-electrode portion can be acquired. The fifth mask can be arranged on an upper end of the top wiring layer to etch the top wiring layer through the fifth mask to generate the second sub-electrode portion. By doing so, the quality and efficiency of the generation of the second sub-electrode portion can be effectively ensured.

In some embodiments, after the second sub-electrode portion is generated at step 908, method 900 can further include cleaning the preset sacrificial layer by using a cleaning solution to obtain the second electrode layer having a bridge structure.

In some embodiments, the second sub-electrode portion can be composed of the non-aluminum superconducting material, and the material can withstand the cleaning operation by using a cleaning solution with high cleaning efficiency. Therefore, pollution existing in the nano-processing process can be removed, thus effectively improving the quality and efficiency of cleaning the preset sacrificial layer. For example, the cleaning solution can include at least one of a hydrofluoric acid solution or a buffered oxide etchant. In some embodiments, the type of the cleaning solution is not limited to the types defined herein, and can be chosen based on specific application requirements and design requirements, as long as the quality of cleaning the preset sacrificial layer by using the cleaning solution can be ensured, thereby improving the quality and efficiency of acquiring the second electrode layer.

Consistent with some embodiments of this disclosure, the first sub-electrode portion and the second sub-electrode portion can be acquired by the methods disclosed herein (e.g., methods 300-900), and the first sub-electrode portion and the second sub-electrode portion can form the second electrode layer. By doing so, the quality and efficiency of the generation of the second electrode layer and the quality and efficiency of the preparation of the Josephson junction can be effectively improved.

Figure 10:
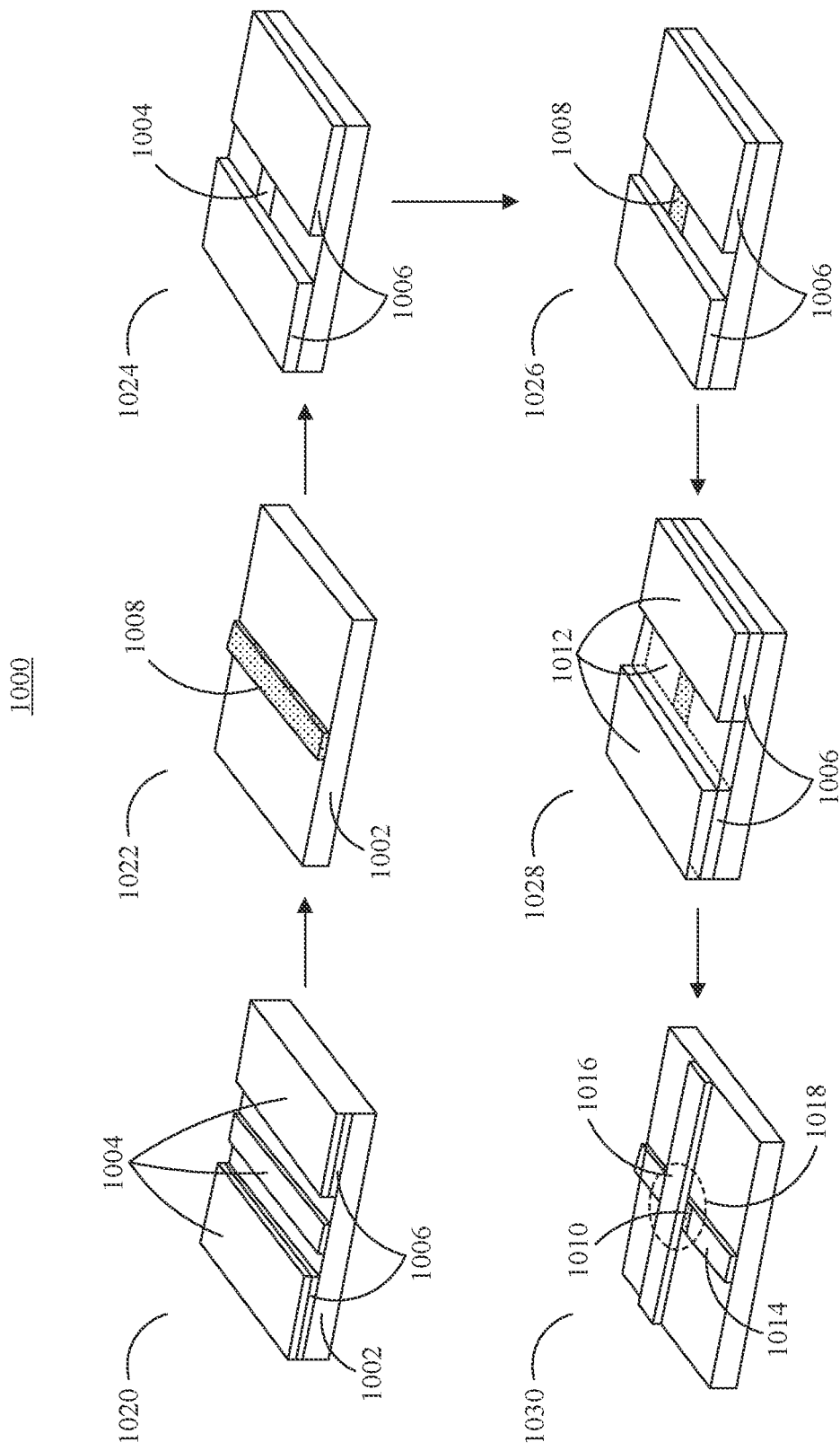
FIG. 10 is a schematic diagram illustrating an example process for Josephson junction preparation, consistent with some embodiments of the present disclosure.

By way of example, FIG. 10 is a schematic diagram illustrating an example process 1000 for Josephson junction preparation, consistent with some embodiments of the present disclosure. As shown in FIG. 10, a Josephson junction preparation method is illustrated in process 1000. The Josephson junction can be prepared by the overlapping junction technology. For example, tantalum Ta can be used as the non-aluminum superconducting material, and tantalum oxide $TaO_x$ can be used as the compound corresponding to the preset material. Process 1000 includes six stages 1020-1030 connected in an order indicated by the arrows in FIG. 10.

At stage 1020, a substrate structure 1002 can be acquired. A first tantalum material 1004 can be deposited for the first time on substrate structure 1002 through a first mask 1006 to generate a first electrode layer (not shown in stage 1020).

At stage 1022, first mask 1006 can be removed, and then a metal oxidation treatment can be performed on first tantalum material 1004 on substrate structure 1002 so that tantalum oxide 1008 can be formed on a surface of first tantalum material 1004. Hydrofluoric (HF) acid or a buffered oxide etchant (BOE) can be used to remove natural oxide formed on the surface of first tantalum material 1004. Substrate structure 1002 can include a first tantalum material structure obtained after the cleaning operation at stage 1022.

At stage 1024, the structure after the cleaning operation can be rotated by 90°. At stage 1026, the rotated structure can be oxidized through first mask 1006. In some embodiments, the structure provided with first mask 1006, substrate structure 1002, and first tantalum material 1004 can be arranged in a pure oxygen environment to be oxidized at stage 1026 for forming an insulating layer (not shown in stage 1024).

At stage 1028, a second tantalum material 1012 can be deposited on an upper end of the insulating layer for the second time by using first mask 1006 to generate a second electrode layer (not shown in stage 1028).

At stage 1030, first mask 1006 can be removed to obtain a Josephson junction 1018 that is formed by first electrode layer 1014, insulating layer 1010, and second electrode layer 1016.

In some embodiments, after first mask 1006 is removed, the structure can be cleaned by using a cleaning solution to reduce the impurity content included in Josephson junction 1018 for improving the quality and efficiency of the preparation of Josephson junction 1018.

Figure 11:
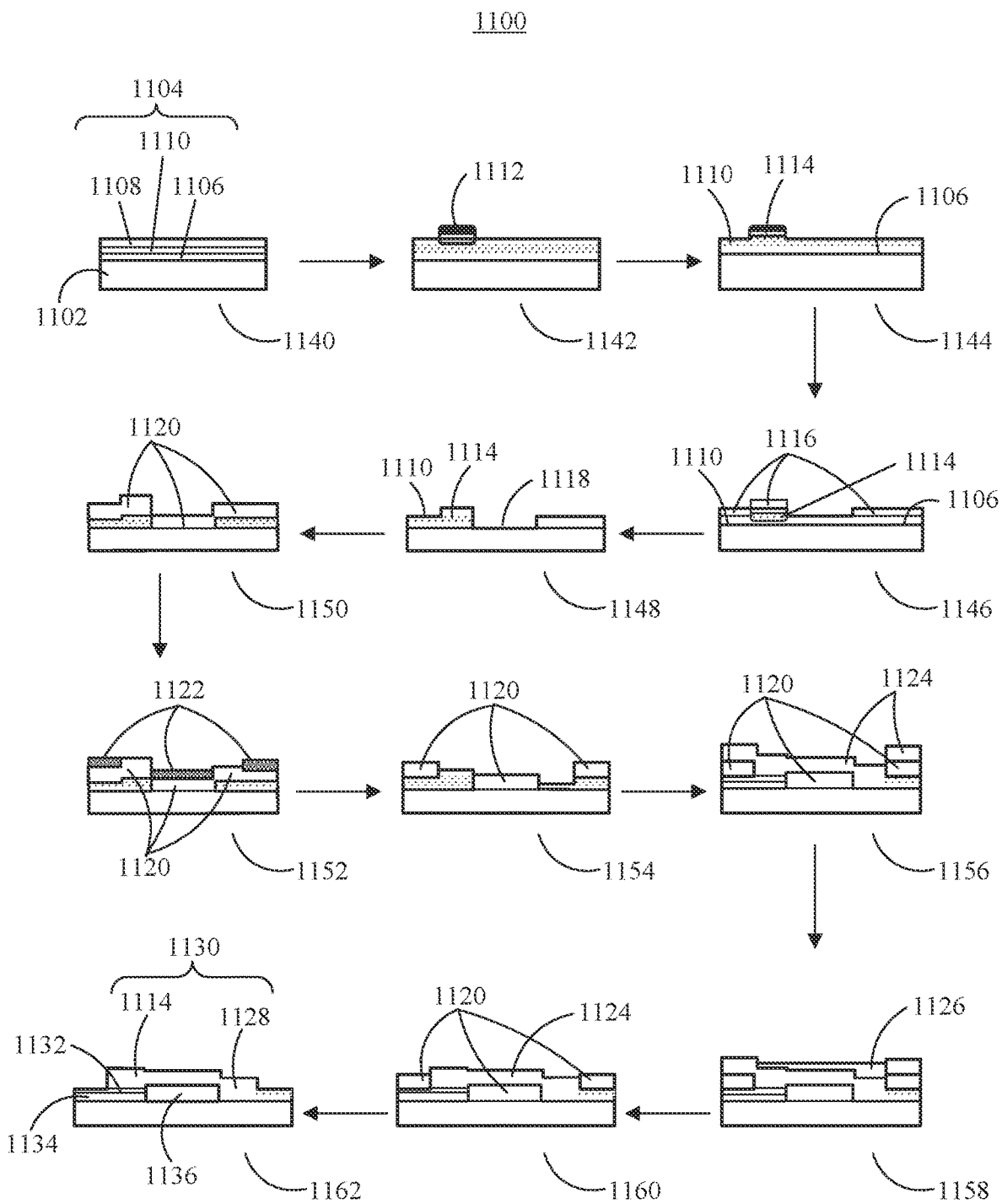
FIG. 11 is a schematic diagram illustrating another example process for Josephson junction preparation, consistent with some embodiments of the present disclosure.

By way of example, FIG. 11 is a schematic diagram illustrating another example process 1100 for Josephson junction preparation, consistent with some embodiments of the present disclosure. The Josephson junction in process 1100 can be prepared by the three-layer junction technology. For example, tantalum Ta can be used as the non-aluminum superconducting material, and tantalum oxide $TaO_x$ can be used as the compound corresponding to the preset material. Process 1100 includes twelve stages 1140-1162 connected in an order indicated by the arrows in FIG. 11.

At stage 1140, a substrate structure 1102 can be acquired. A thin film structure 1104 can be deposited on substrate structure 1102 by using sputtering technology. Thin film structure 1104 can include at least a bottom layer structure 1106 and a top layer structure 1108 composed of a tantalum material. An intermediate layer structure 1110 can be arranged between bottom layer structure 1106 and the top layer structure. For example, intermediate layer structure 1110 can be composed of tantalum oxide.

At stage 1142, a second mask 1112 used to generate a first sub-electrode portion 1114 (will be shown in stage 1144) can be acquired. For example, second mask 1112 can be placed on an upper end of thin film structure 1104, and a pattern etching operation can be performed on thin film structure 1104 by using a photolithography technique to obtain first sub-electrode portion 1114. First sub-electrode portion 1114 can be a part of a second electrode layer 1130.

At stage 1144, a third mask 1116 can be acquired. For example, third mask 1116 can be arranged on thin film structure 1104 that includes first sub-electrode portion 1114. At stage 1146, intermediate layer structure 1110 and bottom layer structure 1106 of thin film structure 1104 can be etched based on third mask 1116. At stage 1148, after the etching, a segmented area 1118 can be obtained being located on one side of first sub-electrode portion 1114.

At stage 1150, a preset material (e.g., silicon oxide SiOx) can be deposited on segmented area 1118 using Plasma Enhanced Chemical Vapor Deposition (PECVD) to form a preset sacrificial layer 1120.

At stage 1152, a fourth mask 1122 can be acquired. At stage 1154, an etching operation can be performed on preset sacrificial layer 1120 through fourth mask 1122 and the photoresist technology to generate a preset pattern.

At stage 1156, a tantalum material 1124 can be deposited on the preset pattern to form a top wiring layer.

At stage 1158, a fifth mask 1126 can be acquired. At stage 1160, the top wiring layer can be etched through fifth mask 1126 by using the photolithography technique.

At stage 1162, a second sub-electrode portion 1128 can be generated. First sub-electrode portion 1114 and second sub-electrode portion 1128 can be connected to form second electrode layer 1130 arranged on an insulating layer 1132. Preset sacrificial layer 1120 can be cleaned by using a cleaning solution to obtain second electrode layer 1130 having a bridge structure. A Josephson junction can be formed by a first electrode layer 1134, insulating layer 1132, and second electrode layer 1130. As shown in stage 1162 of FIG. 11, a gap 1136 can exist between second electrode layer 1130 and substrate structure 1102.

Process 1100 can be used to prepare first electrode layer 1134 and second electrode layer 1130 by using a tantalum material (e.g., tantalum material 1124) with good superconducting features, which is conducive to prolonging the coherence time of superconducting qubits. By doing so, the accuracy of superconducting qubit computing and the quality and efficiency of the preparation of the Josephson junction can be improved. In addition, due to the features of the tantalum material, in process 1100, the cleaning solution can be a solution with a strong cleaning effect, such as a piranha solution or a dilute hydrofluoric acid solution for performing the cleaning operation. By doing so, not only the quality of cleaning can be guaranteed, but also the pollution from the nano-processing process can be removed, thus providing the preparation of Josephson junctions with higher quality and longer consistency, and improving the development potential of superconducting qubit computing.

Consistent with some embodiments of this disclosure, a Josephson junction is provided in the present disclosure. The Josephson junction can be prepared by the methods (e.g., methods 300-900) or processes (e.g., process 1000 or 1100) as disclosed herein. For example, the structure of the Josephson junction can be obtained as Josephson junction 100 in FIG. 1 or Josephson junction 200 in FIG. 2.

Consistent with some embodiments of this disclosure, a superconducting circuit is provided in the present disclosure. Superconducting qubits can be generated when the superconducting circuit is located in a preset environment. For example, the superconducting circuit can include a Josephson junction used as a non-linear inductance element. The Josephson junction can be generated by the methods (e.g., methods 300-900) or processes (e.g., process 1000 or 1100) as disclosed herein.

Figure 12:
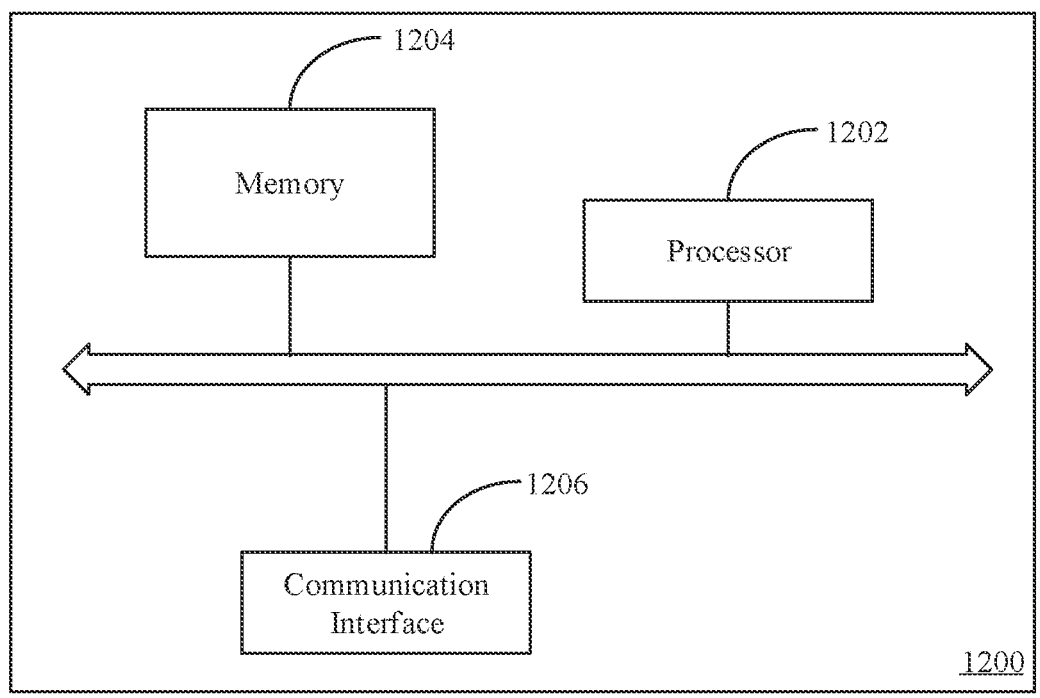
FIG. 12 is a schematic structural diagram illustrating an example apparatus for Josephson junction preparation, consistent with some embodiments of the present disclosure.

FIG. 12 is a schematic structural diagram illustrating an example apparatus 1200 for Josephson junction preparation, consistent with some embodiments of the present disclosure. Apparatus 1200 can be used to prepare a Josephson junction. For example, apparatus 1200 can include a processor 1202 and a memory 1204. Memory 1204 can be used to store a program for apparatus 1200 to perform a Josephson junction preparation method or process (e.g., methods 300-900 or processes 1000-1100 as described in association with FIGS. 3-11) disclosed herein. Processor 1202 can be configured to execute the program stored in memory 1204.

The program includes one or more computer instructions. The one or more computer instructions, when executed by processor 1202, can implement the Josephson junction preparation method or process (e.g., methods 300-900 or processes 1000-1100 as described in association with FIGS. 3-11) disclosed herein. Further, processor 1202 can also be configured to execute all or part of the steps in the Josephson junction preparation method or process (e.g., methods 300-900 or processes 1000-1100 as described in association with FIGS. 3-11) disclosed herein. Apparatus 1200 can also include communication interface 1206 for apparatus 1200 to communicate with another apparatus or a communication network.

Consistent with some embodiments of this disclosure, a non-transitory computer storage medium for storing computer software instructions used by an apparatus is provided herein. The non-transitory computer storage medium can include programs for performing a Josephson junction preparation method or process (e.g., methods 300-900 or processes 1000-1100 as described in association with FIGS. 3-11) disclosed herein.

The embodiments can further be described using the following clauses:

1. A superconducting circuit having a Josephson junction, the superconducting circuit comprising:
   a first electrode layer for signal transmission;
   a second electrode layer for signal transmission; and
   an insulating layer arranged between the first electrode layer and the second electrode layer to form a Josephson junction,
   wherein, the first electrode layer and the second electrode layer are composed of a preset material, the insulating layer is composed of a compound corresponding to the preset material, and the preset material comprises a non-aluminum superconducting material to prolong a coherence time of superconducting qubits.

2. The superconducting circuit of clause 1, wherein the first electrode layer is arranged on a preset substrate, and the second electrode layer is a bridge structure with a first end arranged on the insulating layer and a second end arranged on the preset substrate.

3. The superconducting circuit of any of clauses 1-2, wherein the non-aluminum superconducting material comprises tantalum, and the compound corresponding to the preset material comprises tantalum oxide.

4. The superconducting circuit of any of clauses 1-2, wherein the non-aluminum superconducting material comprises molybdenum, and the compound corresponding to the preset material comprises molybdenum oxide.

5. The superconducting circuit of any of clauses 1-2, wherein the non-aluminum superconducting material comprises vanadium, and the compound corresponding to the preset material comprises vanadium oxide.

6. A method for Josephson junction preparation, comprising:
   acquiring a substrate structure; and
   forming a first electrode layer on the substrate structure, forming an insulating layer on the first electrode layer, and forming a second electrode layer on the insulating layer, wherein the first electrode layer and the second electrode layer are composed of a preset material, the insulating layer is composed of a compound corresponding to the preset material, and the preset material comprises a non-aluminum superconducting material to prolong a coherence time of superconducting qubits, and wherein
   an arrangement of the insulating layer between the first electrode layer and the second electrode layer forms a Josephson junction.

7. The method of clause 6, wherein:
   the non-aluminum superconducting material comprises tantalum, and the compound corresponding to the preset material comprises tantalum oxide; or
   the non-aluminum superconducting material comprises molybdenum, and the compound corresponding to the preset material comprises molybdenum oxide; or
   the non-aluminum superconducting material comprises vanadium, and the compound corresponding to the preset material comprises vanadium oxide.

8. The method of clause 7, wherein forming the first electrode layer on the substrate structure comprises:
   acquiring a first mask for generating the first electrode layer; and
   forming the first electrode layer on the substrate structure through the first mask.

9. The method of clause 8, wherein forming the insulating layer on the first electrode layer comprises:
   oxidizing the first electrode layer to obtain a sacrificial oxide layer;
   removing the sacrificial oxide layer to obtain a pre-processed electrode layer corresponding to the first electrode layer; and
   oxidizing the pre-processed electrode layer to form the insulating layer.

10. The method of clause 9, wherein removing the sacrificial oxide layer to obtain the pre-processed electrode layer corresponding to the first electrode layer comprises:
    cleaning the sacrificial oxide layer using a cleaning solution to obtain the pre-processed electrode layer.

11. The method of clause 6, wherein forming the second electrode layer on the insulating layer comprises:
    forming a thin film structure on the substrate structure, wherein the thin film structure comprises a bottom layer structure and a top layer structure composed of the preset material, and an intermediate layer structure arranged between the bottom layer structure and the top layer structure, and wherein the intermediate layer structure is composed of a compound corresponding to the preset material; and
    etching the thin film structure to obtain a part of the second electrode layer.

12. The method of clause 11, wherein etching the thin film structure to obtain the part of the second electrode layer comprises:

acquiring a second mask for generating a first sub-electrode portion, the first sub-electrode portion being a particular part of the second electrode layer; and etching the thin film structure based on the second mask to obtain the first sub-electrode portion.

13. The method of clause 12, wherein the first sub-electrode portion is a part of the top layer structure.

14. The method of clause 12, wherein after the first sub-electrode portion is obtained, the method further comprises:

acquiring a third mask;

etching the intermediate layer structure and the bottom layer structure of the thin film structure based on the third mask to obtain a segmented area located on one side of the first sub-electrode portion; and generating a second sub-electrode portion connected to the first sub-electrode portion based on the segmented area, wherein the second sub-electrode portion and the first sub-electrode portion are used for forming the second electrode layer, and the second electrode layer is a bridge structure with a first end arranged on the insulating layer and a second end arranged on the preset substrate.

15. The method of clause 14, wherein generating the second sub-electrode portion connected to the first sub-electrode portion based on the segmented area comprises:

forming a preset sacrificial layer on the segmented area;

etching the preset sacrificial layer into a preset pattern;

forming a top wiring layer on the preset pattern; and etching the top wiring layer to generate the second sub-electrode portion.

16. The method of clause 15, wherein after the second sub-electrode portion is generated, the method further comprises:

cleaning the preset sacrificial layer using a cleaning solution to obtain the second electrode layer having a bridge structure.

17. The method of any of clauses 10 or 16, wherein the cleaning solution comprises at least one of a hydrofluoric acid solution or a buffered oxide etchant.

18. A Josephson junction prepared by the method of any of clauses 6-17.

19. A superconducting circuit, comprising:

a Josephson junction used as a nonlinear inductance element, wherein the Josephson junction is generated by the method of any of clauses 6-17.

20. An apparatus for Josephson junction preparation, comprising:

a memory configured to store a set of instructions; and one or more processors communicatively coupled to the memory and configured to execute the set of instructions to cause the apparatus to perform the method of any of clauses 6-17.

21. A device comprising a superconducting circuit, the superconducting circuit comprising a Josephson junction, and the Josephson junction comprising:

a first electrode layer for signal transmission;

a second electrode layer for signal transmission; and an insulating layer arranged between the first electrode layer and the second electrode layer to form the Josephson junction, wherein, the first electrode layer and the second electrode layer are composed of a preset material, the insulating layer is composed of a compound corresponding to the preset material, and the preset material comprises a non-aluminum superconducting material to prolong a coherence time of superconducting qubits.

It should be noted that the example apparatuses and devices described herein are only schematic, where the units described as separate components can or cannot be physically separated, and the components displayed as units can or cannot be physical units (e.g., can be located in one place, or can be distributed to a plurality of network units). Part or all of the modules can be selected in accordance with actual needs to achieve the purpose of the solution of the present embodiment. Those of ordinary skill in the art can understand and implement the solution of the present embodiment without creative effort.

From the description of the above implementations, those skilled in the art can clearly understand that the various implementations can be implemented by means of software plus a necessary hardware platform, and can also be implemented by a combination of hardware and software. Based on such understanding, the above technical solution essentially or the part contributing to the prior art can be embodied in the form of a computer product. The present disclosure can be in the form of a computer program product implemented on one or more computer-usable storage media (including, but not limited to, a magnetic disk memory, a CD-ROM, an optical memory, and the like) including computer usable program code.

The present disclosure is described with reference to flowcharts and/or block diagrams of methods, devices, systems, and computer program products in accordance with embodiments of the present disclosure. It should be understood that each flow and/or block in the flowcharts and/or block diagrams and a combination of flows and/or blocks in the flowcharts and/or block diagrams can be implemented by computer program instructions. These computer program instructions can be provided to a processor of a general-purpose computer, a special-purpose computer, an embedded processor, or another programmable device to produce a machine, so that the instructions executed by the processor of the computer or another programmable device produce an apparatus for realizing the functions specified in one or more flows of the flowcharts and/or one or more blocks of the block diagrams.

These computer program instructions can also be stored in a non-transitory computer-readable memory that can direct a computer or another programmable device to work in a specific manner, so that the instructions stored in this computer-readable memory produce an article of manufacture including an instruction apparatus which implements the functions specified in one or more flows of the flowcharts and/or one or more blocks of the block diagrams.

These computer program instructions can also be loaded onto a computer or another programmable device, so that a series of operation steps are performed on the computer or another programmable device to produce computer-implemented processing, so that the instructions executed on the computer or another programmable device provide steps for implementing the functions specified in one or more flows of the flowcharts and/or one or more blocks of the block diagrams.

In a typical configuration, the computing device includes one or more processors (CPUs), an input/output interface, a network interface, and a memory. The memory can include a volatile memory, a random access memory (RAM), and/or a non-volatile memory in computer-readable media, e.g., a read-only memory (ROM) or a flash RAM. The memory is an example of the computer-readable medium.

The non-transitory computer-readable medium can include permanent or non-permanent, removable or non-removable media, which can implement storage of information by using any method or technology. The information can be computer-readable instructions, data patterns, program modules, or other data. Examples of computer storage media include, but are not limited to, a phase change memory (PRAM), a static random access memory (SRAM), a dynamic random access memory (DRAM), other type of random access memory (RAM), a read-only memory (ROM), an electrically erasable programmable read-only memory (EEPROM), a flash memory or other memory technologies, a compact disc read-only memory (CD-ROM), a digital versatile disc (DVD) or other optical storage, a cassette magnetic tape, tape and disk storage or other magnetic storage devices, or any other non-transmission media, which can be configured to store information accessible by a computing device. As defined herein, the computer-readable medium does not include computer-readable transitory media, such as a modulated data signal and a carrier.

Finally, it should be noted that the above embodiments are only used to illustrate the technical solutions of the present disclosure, and are not intended to limit the present disclosure. Although the present disclosure has been described in detail with reference to the foregoing embodiments, those of ordinary skill in the art should understand that the technical solutions recorded in the foregoing various embodiments can still be modified, or some of the technical features thereof can be equivalently replaced. These modifications or replacements do not cause the essence of the corresponding technical solutions to deviate from the spirit and scope of the technical solutions of the embodiments of the present disclosure.

What is claimed is:

1. A superconducting circuit having a Josephson junction, the superconducting circuit comprising:
    a preset substrate;
    a first electrode layer for signal transmission;
    a second electrode layer for signal transmission; and
    an insulating layer arranged between the first electrode layer and the second electrode layer to form the Josephson junction,
    wherein, the first electrode layer and the second electrode layer are composed of a preset material, the insulating layer is composed of a compound corresponding to the preset material, and the preset material comprises a non-aluminum superconducting material, and
    wherein the first electrode layer is disposed on the preset substrate, the insulating layer is disposed on the first electrode layer, and the second electrode layer is a continuous bridge structure comprising:
        a first end disposed on the insulating layer,
        a second end disposed on the preset substrate, and
        a middle sub-electrode between the first and send ends, the middle sub-electrode being disposed over and forming an air gap from the preset substrate.

2. The superconducting circuit of claim 1, wherein the non-aluminum superconducting material comprises tantalum, and the compound corresponding to the preset material comprises tantalum oxide.

3. The superconducting circuit of claim 1, wherein the non-aluminum superconducting material comprises molybdenum, and the compound corresponding to the preset material comprises molybdenum oxide.

4. The superconducting circuit of claim 1, wherein the non-aluminum superconducting material comprises vanadium, and the compound corresponding to the preset material comprises vanadium oxide.

5. A method for Josephson junction preparation, comprising:
    acquiring a substrate structure; and
    forming a first electrode layer on the substrate structure, forming an insulating layer on the first electrode layer, and forming a second electrode layer on the insulating layer, wherein the first electrode layer and the second electrode layer are composed of a preset material, the insulating layer is composed of a compound corresponding to the preset material, and the preset material comprises a non-aluminum superconducting material to prolong a coherence time of superconducting qubits, and wherein:
    an arrangement of the insulating layer between the first electrode layer and the second electrode layer forms a Josephson junction, and
    forming the second electrode layer on the insulating layer comprises forming a continuous bridge structure comprising:
        a first end on the insulating layer,
        a second end on the substrate structure, and
        a middle sub-electrode between the first and send ends, the middle sub-electrode being disposed over and forming an air gap from the substrate structure.

6. The method of claim 5, wherein the non-aluminum superconducting material and the compound corresponding to the preset material are selected from a group consisting of:
    the non-aluminum superconducting material comprises tantalum, and the compound corresponding to the preset material comprises tantalum oxide;
    the non-aluminum superconducting material comprises molybdenum, and the compound corresponding to the preset material comprises molybdenum oxide; or
    the non-aluminum superconducting material comprises vanadium, and the compound corresponding to the preset material comprises vanadium oxide.

7. The method of claim 6, wherein forming the first electrode layer on the substrate structure comprises:
    acquiring a first mask for generating the first electrode layer; and
    forming the first electrode layer on the substrate structure through the first mask.

8. The method of claim 7, wherein forming the insulating layer on the first electrode layer comprises:
    oxidizing at least a part of the first electrode layer to obtain a sacrificial oxide layer;
    removing at least a part of the sacrificial oxide layer to obtain a pre-processed electrode layer corresponding to the first electrode layer; and
    oxidizing at least a part of the pre-processed electrode layer to form the insulating layer.

9. The method of claim 8, wherein removing at least a part of the sacrificial oxide layer to obtain the pre-processed electrode layer corresponding to the first electrode layer comprises:
    cleaning at least a part of the sacrificial oxide layer using a cleaning solution to obtain the pre-processed electrode layer.

10. The method of claim 5, wherein forming the second electrode layer on the insulating layer comprises:
    forming a thin film structure on at least a part of the substrate structure, wherein the thin film structure comprises a bottom layer structure and a top layer structure composed of the preset material, and an intermediate layer structure arranged between the bottom layer structure and the top layer structure, and wherein the intermediate layer structure is composed of a compound corresponding to the preset material; and etching at least a part of the thin film structure to obtain a part of the second electrode layer.

11. The method of claim 10, wherein the second electrode layer comprises a first sub-electrode portion, and etching the thin film structure to obtain the part of the second electrode layer comprises:

acquiring a second mask for generating a first sub-electrode portion; and etching the at least a part of the thin film structure based on the second mask to obtain the first sub-electrode portion.

12. The method of claim 11, wherein the first sub-electrode portion forms a part of the top layer structure.

13. The method of claim 11, wherein after the first sub-electrode portion is obtained, the method further comprises:

acquiring a third mask;

etching at least the intermediate layer structure and the bottom layer structure of the thin film structure based on the third mask to obtain a segmented area located on one side of the first sub-electrode portion; and generating a second sub-electrode portion connected to the first sub-electrode portion based on the segmented area, wherein the second sub-electrode portion and the first sub- electrode portion are used for forming the second electrode layer, and the second electrode layer is a bridge structure with a first end arranged on the insulating layer and a second end arranged on the substrate structure.

14. The method of claim 13, wherein generating the second sub- electrode portion connected to the first sub-electrode portion based on the segmented area comprises:

forming a preset sacrificial layer on the segmented area;

etching the preset sacrificial layer into a preset pattern;

forming a top wiring layer on the preset pattern; and etching the top wiring layer to generate the second sub-electrode portion.

15. The method of claim 14, wherein after the second sub-electrode portion is generated, the method further comprises:

cleaning the preset sacrificial layer using a cleaning solution to obtain the second electrode layer.

16. The method of claim 9, wherein the cleaning solution comprises a hydrofluoric acid solution.

17. A superconducting circuit, comprising:

a Josephson junction used as a nonlinear inductance element, wherein the Josephson junction is generated by a method, the method comprising:

acquiring a substrate structure; and forming a first electrode layer on the substrate structure, forming an insulating layer on the first electrode layer, and forming a second electrode layer on the insulating layer, wherein the first electrode layer and the second electrode layer are composed of a preset material, the insulating layer is composed of a compound corresponding to the preset material, and the preset material comprises a non-aluminum superconducting material to prolong a coherence time of superconducting qubits, and wherein:

an arrangement of the insulating layer between the first electrode layer and the second electrode layer forms the Josephson junction, and forming the second electrode layer on the insulating layer comprises forming a continuous bridge structure comprising:

a first end formed on the insulating layer, a second end formed on the substrate structure, and a middle sub-electrode between the first and send ends, the middle sub-electrode being disposed over and forming an air gap from the substrate structure.

18. A device comprising a superconducting circuit, the superconducting circuit comprising a Josephson junction, and the Josephson junction comprising:

a preset substrate;

a first electrode layer for signal transmission;

a second electrode layer for signal transmission; and an insulating layer arranged between the first electrode layer and the second electrode layer to form the Josephson junction, wherein, the first electrode layer and the second electrode layer are composed of a preset material, the insulating layer is composed of a compound corresponding to the preset material, and the preset material comprises a non-aluminum superconducting material, and wherein the first electrode layer is disposed on the preset substrate, the insulating layer is disposed on the first electrode layer, and the second electrode layer is a continuous bridge structure comprising:

a first end disposed on the insulating layer, a second end arranged disposed on the preset substrate, and a middle sub-electrode between the first and send ends, the middle sub-electrode being disposed over and forming an air gap from the preset substrate.

* * * * *